(12) United States Patent
Cornea-Hasegan

(10) Patent No.: US 7,707,233 B2
(45) Date of Patent: Apr. 27, 2010

(54) COVERTING A NUMBER FROM A FIRST BASE TO A SECOND BASE

(75) Inventor: Marius A. Cornea-Hasegan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1338 days.

(21) Appl. No.: 11/133,811

(22) Filed: May 19, 2005

(65) Prior Publication Data

US 2006/0265443 A1    Nov. 23, 2006

(51) Int. Cl.
*G06F 15/00* (2006.01)
(52) U.S. Cl. .................................... 708/204
(58) Field of Classification Search .................. 708/204
See application file for complete search history.

(56) References Cited

U.S. PATENT DOCUMENTS

| | | | | |
|---|---|---|---|---|
| 3,803,392 | A | * | 4/1974 | Amdhal et al. ............... 341/84 |
| 4,792,793 | A | * | 12/1988 | Rawlinson et al. ............ 341/89 |
| 6,369,725 | B1 | * | 4/2002 | Busaba ....................... 341/84 |
| 2003/0191787 | A1 | | 10/2003 | Cornea-Hasegan |
| 2004/0059769 | A1 | | 3/2004 | Cornea-Hasegan |
| 2004/0122885 | A1 | | 6/2004 | Cornea-Hasegan |
| 2007/0266072 | A1 | | 11/2007 | Cornea-Hasegan |
| 2007/0266073 | A1 | | 11/2007 | Cornea-Hasegan |

OTHER PUBLICATIONS

Intel®, IA-32 Intel® Architecture Software Developer's Manual—vol. 2A: Instruction Set Reference, A-M, 2004 Intel Corporation (Contents for vol. 2A and 2B, pp. vol. 2A iii-xiv; Figures, pp. vol. 21 xv-xvi; Tables, pp. vol. 2A xvii-xix; and FBSTP-Store BCD Integer and Pop, pp. vol. 2A 3-217-3-219).

Cornea, Marius, et al., "A Software Implementation of the IEEE 754R Decimal Floating-Point Arithmetic Using the Binary Encoding Format", 18th IEEE Symposium on Computer Arithmetic, Montpellier, France, Jun. 25-27, 2007, Internet article at: http://www.lirmm.fr/arith18/papers/CoreaM_Decimal_ARITH18.pdf, [9 pages].

Cornea, Marius, "IEEE 754-2008 Decimal Floating-Point for Intel® Architecture Processors", IEEE Computer Society, 19th IEEE International Symposium on Computer Arithmetic, Portland, Oregon, USA, Jun. 8-10, 2009, Internet article at: http://www.ac.usc.es/arith19/sites/default/files/3670a225-spec-session-DFP-paper2.pdf, [pp. 225-228].

Cornea, Marius, et al., "IEEE 754R Decimal Floating-Point Arithmetic: Reliable and Efficient Implementation for Intel® Architecture Platforms", Intel® Technology Journal, Designing Technology with People in Mind, vol. 11, Issue 01, Published—Feb. 15, 2007, ISSN 1535-864X, DOI: 11.1535/itj.1101.10, Internet article at: http://www.intel.com/technology/itj/2007/v11i1/s2-decimal/1-sidebar.htm, [6 pages (front cover/pp. 91-94/back cover)].

Cornea, Marius, et al., "Software Implementation of the IEEE 754R Decimal Floating-Point Arithmetic", ICSOFT Conference, 2006, CCIS 10 [pp. 97-109].

* cited by examiner

*Primary Examiner*—Chuong D Ngo
(74) *Attorney, Agent, or Firm*—Blakely, Sokoloff, Taylor & Zafman LLP

(57) ABSTRACT

A machine-implemented method converts a number from a first base to a second base. Each one of a first group of machine operation computes a product whose factors include the number in the first base, and a previously calculated approximation to a respective negative power of the second base. A second group of machine operations are performed, each one using results of the first operations, to obtain further results. A respective one or more digits of the number in the second base is also determined, using each of these further results. Other embodiments are also described and claimed.

22 Claims, 2 Drawing Sheets

COVERTING A NUMBER FROM A FIRST BASE TO A SECOND BASE

BACKGROUND

An embodiment of the invention relates generally to microprocessor (or simply, processor) systems, and more particularly, to the capability of such systems for converting a number from a first base representation to a second base representation.

In processor systems, there is frequently a need to convert a number from one base to another base representation. For example, while human users are accustomed to dealing with numbers in their decimal representation, computers typically perform their arithmetic in binary or hexadecimal representation. Thus, when a result has been computed in a processor system as a binary 1101, this will need to be converted to its corresponding "13" for display to a human user.

To efficiently convert between binary and decimal numbers across a wide range (e.g., integers 0 to $10^{18}$) in a processor system, a method has been developed that applies division and remainder operations to the original binary number sequentially. If c is a binary integer to be converted into its decimal format, then c may be represented in decimal as $$c = d_0 \cdot 10^P + d_1 \cdot 10^{P-1} + d_2 \cdot 10^{P-2} + \ldots + d_{p-1} \cdot 10^1 + d_p \quad (1)$$

where the general form above allows for a total of p+1 digits of precision in the decimal representation. The division and remainder method computes each decimal digit recursively, that is the determination of a particular digit depends on a previously calculated adjacent digit. In particular, the following sequence is typically taken:

$$\begin{aligned} d_p &= c \ \% \ 10 & c_1 &= (c - d_p)/10 \\ d_{p-1} &= c_1 \ \% \ 10 & c_2 &= (c_1 - d_{p-1})/10 \\ &\ldots \\ d_1 &= c_{p-1} \ \% \ 10 & c_p &= (c_{p-1} - d_1)/10 \\ d_0 &= c_p \ \% \ 10 \end{aligned} \quad (2)$$

The percentage sign in Equation (2) above refers to the remainder of the division of the two operands. First, $d_p$ is computed, by taking the remainder of c (the number to be converted, in binary format) divided by 10. Next, $c_1$ is computed as shown, followed by $d_{p-1}$ which uses $c_1$. The sequence thus continues until $d_0$, the last digit of the decimal representation, has been computed. This algorithm thus calculates, in sequence, for the case of an 18 digit decimal representation, $d_{17}, c_1, d_{16}, c_2, \ldots d_1, c_{17}$, and $d_0$.

In most modem processor systems, the arithmetic operations in Equation (2) above would actually be computed in binary format using, for example, division units that may be part of the arithmetic and logic unit (ALU) of a processor. An example of a processor instruction that converts a binary integer into a decimal integer is the FBSTP-Store BCD Integer and Pop instruction for the IA-32 Intel® Architecture (see IA-32 Intel® Architecture Software Developer's Manual, Volume 2A, page 3-217 (Order Number 253666, 2004)). Note that BCD refers to binary coded decimal, where each digit of the decimal representation is represented by a binary code.

Since the conversion between binary and decimal occurs quite frequently during operation of a processor system, faster conversion methodologies can greatly benefit the overall performance of the system.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

A machine-implemented method for converting a number from a first base to a second, different base is described that exposes more instruction-level parallelism, to achieve faster conversions. The method may in general be applied to convert from a base b, where b is greater than or equal to 2, to a different base B, where B is also greater than or equal to 2. The underlying arithmetic operations in the conversion may be implemented in base b. For most modem processor systems, b=2 (binary format), and B=10 (decimal format). The methodology described here, however, can alternatively be applied to other base conversions, as well as being implemented in processor systems whose arithmetic operations are not necessarily performed in binary arithmetic.

In embodiments illustrated here, a positive, binary integer is converted into its decimal format. However, negative numbers can also be converted using such methodologies, by treating the sign of the number separately. The methodologies are also applicable to conversions from binary to decimal floating-point formats, if the decimal floating-point data types have integer decimal coefficients.

Figure 1:
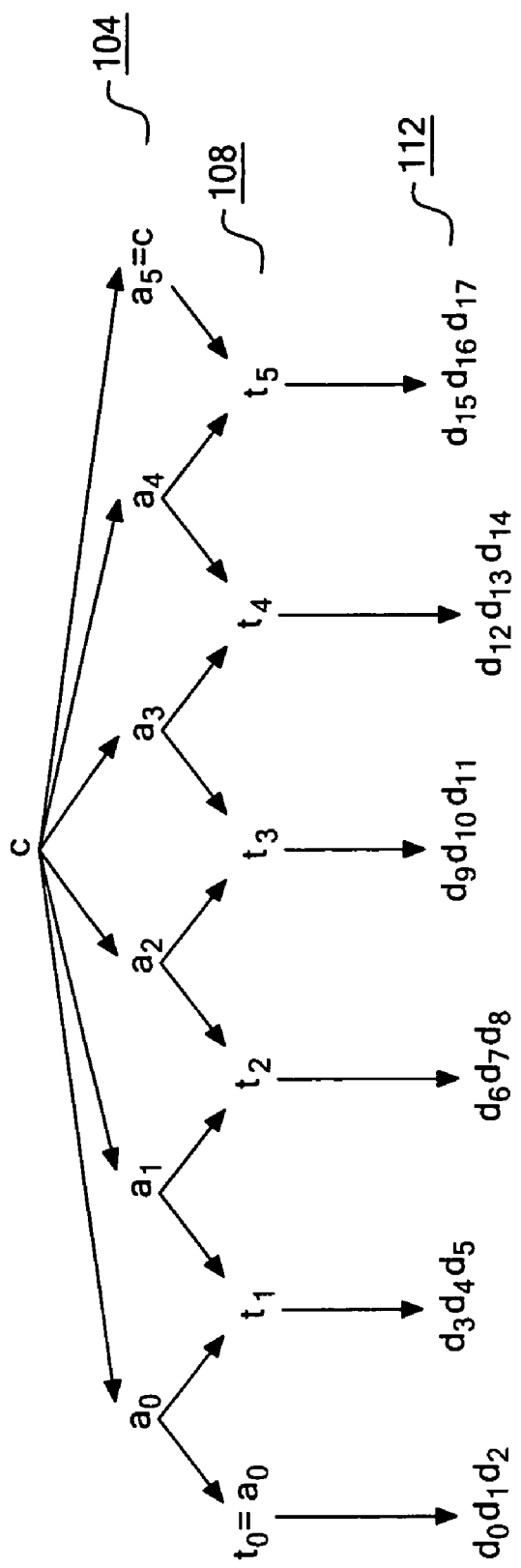
FIG. 1 shows a flow diagram of operations for converting a number from a first base to a second base, according to an embodiment of the invention.

Referring to FIG. 1 now, a flow diagram of a method for conversion of a binary positive integer c, into its decimal format, is shown. For this example, the decimal format has a total of 18 digits (also referred to as its precision). The method may be machine-implemented by, for example, a processor system, either entirely in software or as described further below, by a predominantly circuit hardware implementation within the processor. In operation 104, a number of machine operations are performed, where in each a product is computed whose factors include the binary number (c), and a previously calculated approximation to a respective, negative power of 10 (e.g., approximations to $10^{-1}, 10^{-2}, 10^{-3}, \ldots$). In the example here, these products include at least $a_1, a_2, a_3$, and $a_4$. In this example, there are at least four such products, however in general there may be two or more, depending upon the precision of the decimal representation. Note also that $a_0$ and $a_5$ are at the "boundary" of the methodology and as such, may need special treatment. For example, $a_5$ in this example is simply set equal to the original, binary integer c.

In some conventional processor systems, a multiplication instruction is issued to the processor at the rate of one per processor clock cycle, in each floating-point unit that is available for executing the instruction. Accordingly, reducing the number of such multiplications directly impacts the number of clock cycles required for the conversion. To help reduce the number of multiplications, and also because of special encoding that has been proposed for a revision of the floating-point formats by the Institute of Electrical and Electronics Engineers, IEEE Standard 754-1985 for Binary Floating-Point Arithmetic ("revised IEEE Standard 754"), only powers of ten with an exponent that is a multiple of three should be used.

Next, the method proceeds with operation 108 in which a second set of machine-operations are performed using results of the first operation 104, to obtain further results which include at least $t_1, t_2, \ldots t_4$. As in the first operations, there may also be results $t_0$ and $t_5$ which are at the boundary and accordingly may be given special treatment, e.g. $t_0=a_0$. Advantageously, this methodology allows $a_0$-$a_4$ to be computed in parallel, and also allows $t_1$-$t_5$ to be computed in parallel, thereby helping accelerate the overall conversion process.

The next operation in FIG. 1 is operation 112, in which each of the further results $t_1, t_2, \ldots$ is used, to determine a respective one or more digits of the number in the decimal format. In this example, each of the results $t_0, t_1, \ldots$ yields a respective set of three, contiguous digits of the decimal number, to thus complete the conversion process.

Additional details of the methodology illustrated in FIG. 1 are as follows, in Equations (3) and (4). The approximations to the respective negative powers in this example are approximations to $10^{-15}$, $10^{-12}$, $10^{-9}$, $10^{-6}$, and $10^{-3}$. A reason why these are referred to as being "approximations", instead of "exact", is that under binary arithmetic implementation, negative powers of 10 cannot be represented exactly. These approximations may be referred to as constants, $k_{15}$, $k_{12}$, $k_9$, $k_6$, and $k_3$, meaning that they need not be changed when converting several different numbers using the methodology.

$$a_0 = \text{floor } (c \cdot k_{15}) // \text{by Property 1, } a_0 = d_0 \cdot 10^2 + d_1 \cdot 10 + d_2$$

$$a_1 = \text{floor } (c \cdot k_{12}) // \text{by Property 1, } a_1 = d_0 \cdot 10^5 + d_1 \cdot 10^4 + \ldots + d_4 \cdot 10^1 + d_5$$

$$a_2 = \text{floor } (c \cdot k_9) // \text{by Property 1, } a_2 = d_0 \cdot 10^8 + d_1 \cdot 10^7 + \ldots + d_7 \cdot 10^1 + d_8$$

$$a_3 = \text{floor } (c \cdot k_6) // \text{by Property 1, } a_3 = d_0 \cdot 10^{11} + d_1 \cdot 10^{10} + \ldots + d_{10} \cdot 10^1 + d_{11}$$

$$a_4 = \text{floor } (c \cdot k_3) // \text{by Property 1, } a_4 = d_0 \cdot 10^{14} + d_1 \cdot 10^{13} + \ldots + d_{13} \cdot 10^1 + d_{14}$$

$$// a_5 = c = d_0 \cdot 10^{17} + d_1 \cdot 10^{16} + \ldots + d_{16} \cdot 10^1 + d_{17}$$

$$// a_0 = t_0 = d_0 \cdot 10^2 + d_1 \cdot 10 + d_2 \quad (3)$$

$$t_1 = a_1 - 1000 \cdot a_0 // t_1 = d_3 \cdot 10^2 + d_4 \cdot 10 + d_5$$

$$t_2 = a_2 - 1000 \cdot a_1 // t_2 = d_6 \cdot 10^2 + d_7 \cdot 10 + d_8$$

$$t_3 = a_3 - 1000 \cdot a_2 // t_3 = d_9 \cdot 10^2 + d_{10} \cdot 10 + d_{11}$$

$$t_4 = a_4 - 1000 \cdot a_3 // t_4 = d_{12} \cdot 10^2 + d_{13} \cdot 10 + d_{14}$$

$$t_5 = a_5 - 1000 \cdot a_4 // t_5 = d_{15} \cdot 10^2 + d_{16} \cdot 10 + d_{17} \quad (4)$$

As seen in the above detail, each of the partial results $a_0$, $a_1, \ldots$ is given by the product of c and a respective constant, truncated to the largest integer which is not greater than its real argument (the floor function). Note that the constants $k_3$, $k_6, \ldots$ may be previously calculated or otherwise obtained and stored, prior to invoking the method for conversion.

In Equations (4) above, a second set of quantities $t_1, t_2, \ldots$ $t_5$ are computed, where for each quantity, a linear combination of a respective set of two of the first quantities $a_0, \ldots a_5$ is computed. In particular, a multiply-add operation may be performed for each $t_i$, as shown. In this example, each computed $t_i$ will be a value that lies between 0 and 999 (decimal). Thus, referring back to FIG. 1, $t_1$ is a binary number (assuming an underlying binary arithmetic implementation) that represents the contiguous portion $d_3 d_4 d_5$ of c in decimal format.

Another contiguous portion, $d_0 d_1 d_2$, is represented by $t_0$. Yet another, $d_6 d_7 d_8$, is represented by $t_2$, and so on.

The quantity $t_i$ may be used as an index into a table of entries each of which contains the encoding of a respective, three-digit decimal value that may be numerically equal to the index. In other words, the table is a previously computed look-up table with, in this example, 1000 entries, where each entry contains the decimal format of a binary number in the range 0-999. In the example here where the precision of the decimal representation is 18 digits, each entry of this look-up table refers to three decimal digits that are encoded in BCD format, where each table entry may contain 12 bits (4 bits for each digit). If, however, the three decimal digits are encoded as specified in the proposed, revised IEEE Standard 754, then each table entry need contain no more than 10 bits (this is also referred to as densely packed decimal encoding, or DPD in short).

As was explained above in the Background section, a conventional technique for converting from a first base to a second base calculates the digits of the second base representation in a sequence of division and remainder operations. The methodology described above, in accordance with an embodiment of the invention, advantageously avoids a large number of division or remainder operations, in favor of typically faster multiplications. In addition, these multiplications may be performed in parallel in at least two different levels ($a_i$ and $t_i$), thereby further accelerating the conversion process. As an example, a purely software implementation of the conversion methodology described above, for converting a positive binary integer into decimal format, has been implemented on an ITANIUM 2 processor platform of Intel Corp., Santa Clara, Calif., measuring thirty-one (31) processor clock cycles. Compare this with the several hundred clock cycles typically needed by the FBSTP instruction.

A breakdown of the thirty-one cycles may be as follows: six (6) are taken for loading the constants $k_i$ (using, e.g., LDF instructions), 4+7 (11) for calculating a $a_i$ (e.g., using FMPY and FCVT.FX.TRUNC instructions), four (4) for calculating $t_i$ with, e.g. XMA instructions, seven (7) for calculating the index to the look-up table (e.g., using GETF.SIG, SHL, and ADD), and finally one (1) instruction for loading a group of three decimal digits from the table (e.g., using LD2). There may also be two additional clock cycles needed for the delayed issue of instructions that cannot be issued in the same clock cycle. Note that the instructions for calculating the $a_i$ and those for calculating $t_i$ can each be executed in parallel, thus further reducing the latency of the conversion.

The following property has been defined so as to ensure that the conversion method described above works correctly, for all integer numbers c that do not exceed the maximum output value that can be represented, in this example from 0 to 999999999999999999. The property referred to here as Property 1 is stated here for b=2 and B=10, however, it is true for any b greater than or equal to 2 and B greater than or equal to 2. To clarify some of the nomenclature used below: the floor( ) function returns the largest integer not greater than its real argument; the ceil( ) function returns the smallest integer not less than its real argument; the frac( ) function returns the fractional part, and is frac(x)=x−floor(x), $0 \leq \text{frac}(x) < 1$.

Property 1

Let $c \in N$ be a number in base b=2, and $d_0 \cdot 10^p + d_1 \cdot 10^{p-1} + d_2 \cdot 10^{p-2} + \ldots + d_{p-1} \cdot 10^1 + d_p$ its representation in base B=10, with $d_0, d_1, \ldots d_p \in \{0, 1, \ldots, 9\}$. Let $x \in \{1, 2, 3, \ldots, p\}$ and $\rho = \ln 10 / \ln 2$.

If $y \in N$, $y \geq \text{ceil}(\text{frac}(\rho \cdot x) + \rho \cdot (p+1))$ and $k_x$ is the value of $10^{-x}$ rounded up (toward positive infinity) to y bits, $$k_x = (10^{-x})_{Rp,y} \quad (5)$$

then $$\text{floor } (c \cdot k_x) = d_0 \cdot 10^{p-x} + d_1 \cdot 10^{p-x-1} + d_2 \cdot 10^{p-x-2} + \ldots + d_{p-x-1} \cdot 10^1 + d_{p-x} \quad (6)$$

(Note that rounding for example to nearest or to fewer bits than the minimum y may not yield the correct product for all integer numbers c that do not exceed the maximum output value that can be represented, in this example from 0 to 999999999999999999.

Proof:

$$10^{-x} = 2^{-\rho \cdot x} = 2^{-\rho \cdot x} \cdot 2^{\text{floor}(-\rho \cdot x)} \cdot 2^{\text{floor}(-\rho \cdot x)} = 2^{\text{frac}(-\rho \cdot x)}.$$

As $1 \leq 2^{\text{frac}(-\rho \cdot x)} < 2$ and rounding is to y bits:

$$ulp(k_x) = 2^{\text{floor}(-\rho \cdot x) - y + 1}$$

Let $$H = d_0 \cdot 10^{p-x} + d_1 \cdot 10^{p-x-1} + d_2 \cdot 10^{p-x-2} + \ldots + d_{p-x-1} \cdot 10^1 + d_{p-x}$$

where $H \leq 10^{p-x+1} - 1$. It is necessary to show that:

$$H \leq c \cdot k_x < H + 1 \Longleftrightarrow$$

$$H \leq (d_0 \cdot 10^p + d_1 \cdot 10^{p-1} + d_2 \cdot 10^{p-x-2} + \ldots + d_{p-x} \cdot 10^x + d_{p-x+1} \cdot 10^{x-1} + \ldots + d_p) \cdot (10^{-x} + e_x) < H + 1$$

where $k_x = 10^{-x} + e_x$, with $e_x$ the rounding error and $0 \leq e_x < 1$ $ulp(k_x)$. The inequalities to prove are:

$$H \leq (10^x \cdot H + d_{p-x+1} \cdot 10^{x-1} + \ldots + d_p) \cdot (10^{-x} + e_x) < H + 1$$

The first inequality is clearly satisfied as $10^x \cdot H \cdot 10^{-x} = H$. For the second, notice that:

$$d_{p-x+1} \cdot 10^{x-1} + \ldots + d_p \leq 10^x - 1$$

It is thus sufficient to prove that:

$$(10^x \cdot H + 10^x - 1) \cdot (10^{-x} + ulp(k_x)) \leq H + 1 \Longleftrightarrow$$

$$[10^x \cdot (H+1) - 1] \cdot (10^{-x} + 2^{\text{floor}(-\rho \cdot x) - y + 1}) \leq H + 1 \Longleftrightarrow$$

$$10^x \cdot (H+1) 2^{\text{floor}(-\rho x) - y + 1} - 10^{-x} 2^{\text{floor}(-\rho \cdot x) - y + 1} \leq 0 \Longleftrightarrow$$

$$[10^x \cdot (H+1) - 1] \cdot 2^{-\text{floor}(\rho \cdot x) - y} \leq 10^{-x}$$

(we used the fact that for a non-integer z, floor(z) + floor(-z) = -1)

As $H + 1 \leq 10^{p-x+1}$, it is sufficient to show that:

$$(10^{p+1} - 1) \cdot 2^{-\text{floor}(\rho \cdot x) - y} \leq 10^{-x}$$

It is sufficient then to prove that:

$$10^{p+1} \cdot 2^{-\text{floor}(\rho \cdot x) - y} \leq 10^{-x} \Longleftrightarrow$$

$$10^{p+x+1} \leq 2^{\text{floor}(\rho \cdot x) + y} \Longleftrightarrow$$

$$2^{\rho \cdot (p+x+1)} \leq 2^{\text{floor}(\rho \cdot x) + y} \Longleftrightarrow$$

$$\rho \cdot (p+x+1) \leq \text{floor}(\rho \cdot x) + y$$

It is sufficient to prove that:

$$\rho \cdot (p+x+1) \leq \text{floor}(\rho \cdot x) + y_{min} \Longleftrightarrow$$

$$\rho \cdot (p+x+1) \leq \text{floor}(\rho \cdot x) + \text{ceil}(\text{frac}(\rho \cdot x) + \rho \cdot (p+1)) \Longleftrightarrow$$

$$\rho \cdot (p+x+1) \leq \text{ceil}(\text{floor}(\rho \cdot x) + \text{frac}(\rho \cdot x) + \rho \cdot (p+1)) \Longleftrightarrow$$

$$\rho \cdot (p+x+1) \leq \text{ceil}(\rho \cdot x + \rho \cdot (p+1)) \Longleftrightarrow$$

$$\rho \cdot (p+x+1) \leq \text{ceil}(\rho \cdot (p+x+1))$$

This is true, and concludes the proof.

The values of $y_{min}$ for p=17 and three other precisions defined by the revised IEEE Standard 754 are shown in the following table giving the precision of the multiplicative constants as a function of the decimal data type precision. The constants $k_i$ that may be pre-calculated are also listed.

| p | 6 | 15 | 17 | 33 |
|---|---|---|---|---|
| $y_{min}$ | 25 | 55 | 61 | 114 |
| Pre-calculated constants | $k_6, k_3$ | $k_{15}, k_{12}, k_9,$ $k_6, k_3$ | $k_{15}, k_{12}, k_9,$ $k_6, k_3$ | $k_{33}, k_{30}, k_{27},$ $k_{24}, k_{21}, k_{18},$ $k_{15}, k_{12}, k_9,$ $k_6, k_3$ |

Thus, if the approximations to the negative powers of 10 are calculated to a predetermined and sufficient precision, the methodology for converting binary integers to decimal as described above is correct for all integer numbers c that do not exceed the maximum output value that can be represented, in this example form 0 to 999999999999999999. Note that although in the above examples, there are fewer constants k being used whenever the precision p is substantially smaller, this need not be true in all cases. For example, for both p=15 and p=17, there are five constants.

The methodology described above may be used to significantly improve the latency of processor instructions that perform base conversions, such as the FBSTP instruction on the IA-32 architecture. The methodology replaces many division and remainder operations by relatively simple multiplications, with constants being used that are approximations to negative powers of the second base (where these constants may be pre-calculated). In addition, the methodology replaces the sequential nature of conventional algorithms with a method that exposes more instruction-level parallelism, which can be used better on processors that have pipelined functional units, multiple functional units, or multi-core processors.

Figure 2:
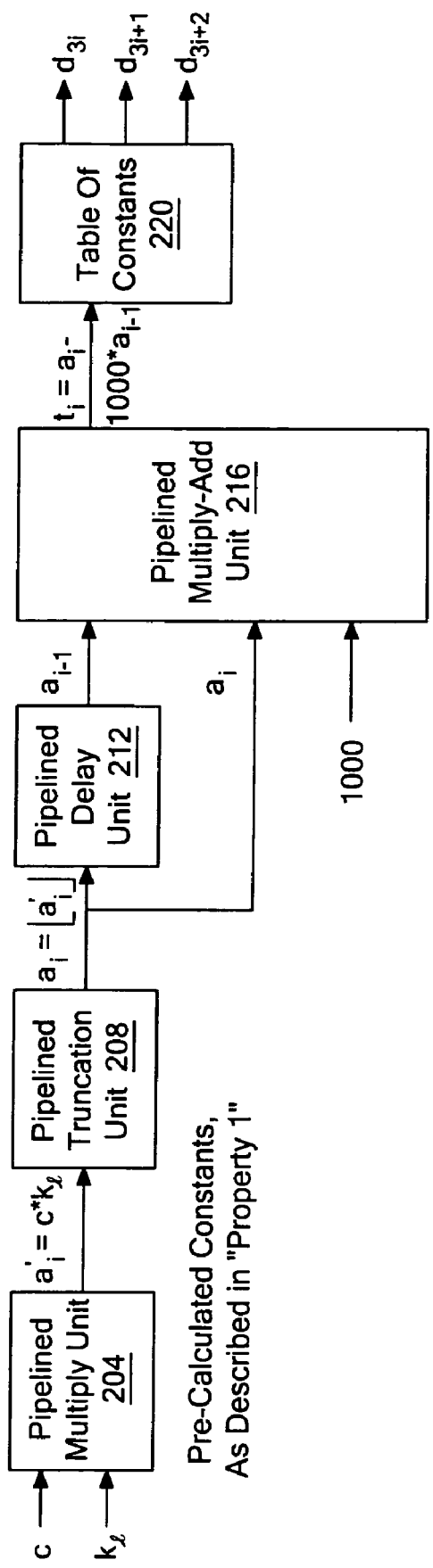
FIG. 2 is a block diagram of a circuit hardware implementation of a conversion methodology, according to an embodiment of the invention.

As an alternative to a purely software implementation, FIG. 2 shows a predominantly circuit hardware implementation of a method for converting positive, binary integers into a decimal format. The block diagram of FIG. 2 may be part of a processor in which there are a number of instruction execution units that should be pipelined, for better performance. A multiply unit 204 has an operand input to receive a number, c, in a first base, and another operand input to receive a constant $k_i$. A result output of the multiply unit 204 is coupled to a truncation unit 208. An operand input of the truncation unit is to receive, in this example, $a'_i$, which is in this case equal to the product of c and $k_i$. Note that the $k_i$ are constants that should be pre-calculated, as described in relation to Property 1 above.

A delay unit 212 has its input coupled to a result output of the truncation unit (which delivers the integer $a_i$). The delay unit 212 serves to hold a previous result $a_{-1}$, until a subsequent result $a_i$ becomes available at the truncation unit output.

See for example, Equation (4) above where, for example, $t_3$ is computed to be a linear combination of $a_2$ and $a_3$. This linear combination may be a multiply-add operation, performed by a multiply-add unit 216 (back to FIG. 2). A further operand input of the multiply-add unit 216 is coupled to receive a constant value, namely 1000 (decimal) in this case (in accordance with Equation (4) above). Note that a purpose of the delay unit 212 is only to synchronize the values that are at the inputs of the multiply-add unit 216, if needed by the latter hardware unit. More generally, the delay unit 212 may be part of the output of the truncation unit 208 or an input of the multiply-add unit 216. Finally, an output of the multiply-add unit 216 provides a further result $t_i$ in accordance with Equation (4), which represents one or more digits of the decimal representation.

For even better performance, a pre-calculated table of constants 220 may be added that has an input coupled to a result output of the multiply-add unit 216, so that the $t_i$ acts as an index into the table. An output of the table 220 provides one or more digits of the number in the decimal representation, where in this case three contiguous digits are provided by each entry of the table. For example, if the index is $t_5$ (see Equation (4)), then the output digits are $d_3$ $d_4$ $d_5$. Other mappings are, of course, possible between the index and the output of the table.

An embodiment of the invention may be a machine readable medium having stored thereon instructions which program a processor to perform some of the operations described above, e.g. multiply-add instructions; truncate instructions. In other embodiments, some of these operations might be performed by specific hardware components that contain hardwired logic (see the circuit hardware units of FIG. 2). Those operations might alternatively be performed by any combination of programmed computer components and custom hardware components.

A machine-readable medium may include any mechanism for storing or transmitting information in a form readable by a machine (e.g., a computer), not limited to Compact Disc Read-Only Memory (CD-ROMs), Read-Only Memory (ROMs), Random Access Memory (RAM), Erasable Programmable Read-Only Memory (EPROM), and a transmission over the Internet.

Further, a circuit hardware design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional microelectronic fabrication techniques are used, data representing a hardware model may be the data specifying the presence or absence of various features on different mask layers for masks used to produce the integrated circuit. In any representation of the design, the data may be stored in any form of a machine-readable medium.

The invention is not limited to the specific embodiments described above. For example, the binary to decimal conversion described above uses previously calculated approximations to only powers of ten whose exponents are a multiple of three. However, in general, other sets of powers of the second base may be selected for use in the conversion methodology, depending upon, for example, the format and precision of the representation in the second base. Accordingly, other embodiments are within the scope of the claims.

What is claimed is:

1. A machine-implemented method for converting a number from a first base to a second base, comprising:
    performing a first plurality of machine operations where in each one a product is computed whose factors include the number in the first base and a previously calculated approximation by a computer to a respective negative power of the second base;
    performing a second plurality machine operations using results of the first operations by the computer to obtain a plurality of further results; and
    determining a respective one or more digits of the number in the second base by the computer using each of the further results.

2. The method of claim 1 wherein the first operations are performed in parallel.

3. The method of claim 2 where the second operations are performed in parallel.

4. The method of claim 1 wherein each one of the second operations includes a multiply-add whose operands include a respective pair of the results of the first operations.

5. The method of claim 4 wherein the first operations are performed in parallel, and the second operations are performed in parallel.

6. The method of claim 1 wherein the determining a respective one or more digits of the number in the second base comprises using each of the further results as an index to a lookup table that yields a set of digits that are treated as those of the number in the second base.

7. The method of claim 5 wherein the number is a positive integer, the first base is base 2, and the second base is base 10.

8. A processor comprising:
    a plurality of instruction execution units of a processor, which include
    a multiply unit having an operand input to receive a number in a first base and another operand input to receive a constant;
    a truncation unit having an operand input coupled to a result output of the multiply unit; and
    a multiply-add unit having an operand input coupled to receive a result from the truncation unit, another operand input coupled to receive another result from the truncation unit, and yet another operand input to receive another constant, wherein an output of the multiply-add unit represents one or more digits of the number in a second base.

9. The processor of claim 8 further comprising a table of constants having an input coupled to a result output of the multiply-add unit and an output that provides a digit of the number in the second base.

10. The processor of claim 9 wherein the execution units are pipelined.

11. The processor of claim 8 wherein the multiply and multiply-add units operate in binary arithmetic.

12. The processor of claim 8 wherein said another constant is the second base taken to an integer power that is larger wherever a precision of the number in the second base is greater.

13. An article of manufacture comprising:
    a machine-accessible storage medium having stored therein data that when accessed by a processor
    converts a binary number into its decimal representation by multiplying each of a plurality of constants by the binary number, where each constant approximates ten taken to a different negative power, computes a plurality of lookup table index values each from an arithmetic operation involving a respective pair of results of said multiplications, and for each value obtains a plurality of digits, using a lookup table, that are those of the decimal representation.

14. The article of manufacture of claim 13 wherein the plurality of constants are fewer than the total number of digits in the decimal representation.

15. The article of manufacture of claim 13 wherein the plurality of constants are such that $$\text{floor}(c \cdot k_x) = d_0 \cdot 10^{p-x} + d_1 \cdot 10^{p-x-1} + d_2 \cdot 10^{p-x-2} + \ldots + d_{p-x-1} \cdot 10^1 + d_{p-x} \quad (6)$$

is true, where $k_x$ is one of the plurality of constants, c is the binary number, $d_0, d_1 \ldots d_p$ are the digits of the decimal representation and are members of $\{0,1,2,\ldots,9\}$, x is a member of $\{1,2,3,\ldots,p\}$ and there are a total of p+1 digits in the decimal representation.

16. The article of manufacture of claim 13 wherein there are fewer of the plurality of constants whenever a precision of the decimal representation is smaller.

17. A machine-implemented method for converting a number in a first base to a second base, comprising:

calculating in parallel a plurality of first quantities including, for each quantity, multiplying by a computer a number in a first base by a respective constant;

truncating to an integer by the computer each of the plurality of first quantities;

calculating in parallel a plurality of second quantities including, for each quantity, computing by the computer a linear combination of two of the first quantities; and using each of the second quantities to obtain by the computer a respective one or more digits of the number in the second base.

18. The method of claim 17 wherein the calculating first and second quantities and the truncating are performed in binary arithmetic.

19. The method of claim 18 wherein each of the second quantities represents one or more respective, contiguous digits of the number in the second base.

20. The method of claim 17 wherein the respective constant is the second base taken to a respective negative power, and rounded up, and the truncated first quantity is equal to a sum of a plurality of products, where each product includes a product of (1) a respective digit of the number in the second base and (2) the second base taken to a respective power, wherein a sum of the respective power and the respective digit's position remains constant for all of said plurality of products.

21. The method of claim 20 wherein the number in the first base is a positive binary integer and the number in the second base is a positive decimal integer.

22. The method of claim 21 wherein the respective constant is ten taken to the respective negative power, and rounded up, and each of the second quantities represents three respective, contiguous digits of the decimal integer.

* * * * *